United States Patent [19]
Konishi et al.

[11] Patent Number: 5,608,943
[45] Date of Patent: Mar. 11, 1997

[54] APPARATUS FOR REMOVING PROCESS LIQUID

[75] Inventors: Nobuo Konishi; Kenji Sekiguchi, both of Tokyo, Japan

[73] Assignee: Tokyo Electron Limited

[21] Appl. No.: 293,582

[22] Filed: Aug. 22, 1994

[30] Foreign Application Priority Data

Aug. 23, 1993 [JP] Japan ................................... 5-229550

[51] Int. Cl.⁶ ..................................................... B08B 5/04
[52] U.S. Cl. ...................... 15/302; 134/109.2; 134/902; 134/153; 134/148; 118/50
[58] Field of Search ................................ 134/144, 153, 134/148, 902, 104.2; 15/302, 321; 118/50

[56] References Cited

U.S. PATENT DOCUMENTS

| | | | |
|---|---|---|---|
| 3,630,804 | 12/1971 | Coffman | 134/153 |
| 3,737,940 | 6/1973 | Moestue et al. | 15/302 |
| 4,003,717 | 1/1977 | Sumnitsch | 134/155 |
| 4,611,553 | 9/1986 | Iwata et al. | 15/302 |
| 4,694,527 | 9/1987 | Yoshizawa | 15/302 |
| 4,750,505 | 6/1988 | Inuta et al. | 15/302 X |
| 4,790,262 | 12/1988 | Nakayama et al. | 134/153 |
| 4,838,289 | 6/1989 | Kottman et al. | 134/153 |
| 4,982,694 | 1/1991 | Sekiguchi . | |
| 5,028,955 | 7/1991 | Hayashida et al. . | |
| 5,095,927 | 3/1992 | Thompson et al. | 134/105 |

FOREIGN PATENT DOCUMENTS 5-190442  7/1993  Japan ..................................... 134/186

*Primary Examiner*—Frankie L. Stinson
*Attorney, Agent, or Firm*—Graham & James LLP

[57] ABSTRACT

A resist processing apparatus has a washing nozzle inclined outward at a predetermined angle, for jetting a washing liquid to a vicinity of the undersurface of the peripheral portion of an article to be processed, and a collecting device for collecting the washing liquid from a portion above the article. The washing liquid is supplied by the force of the jet and the centrifugal force of the washing liquid from the washing nozzle to the undersurface of the article to remove coated films formed on the peripheral portion of the undersurface of the article. The washing liquid further reaches the upper surface of the article through the peripheral edge of the article. The width of the coated films to be removed is adjusted by properly regulating the amount of flow and the sucked amount of the washing liquid determined by its viscosity. The unnecessary coated films not only on the upper surface and the undersurface of the article but also on the vertical edge of the peripheral portion of the article are removed by supplying the washing liquid from the washing nozzle provided under the undersurface of the article.

24 Claims, 13 Drawing Sheets

FIG.16A
FIG.16B
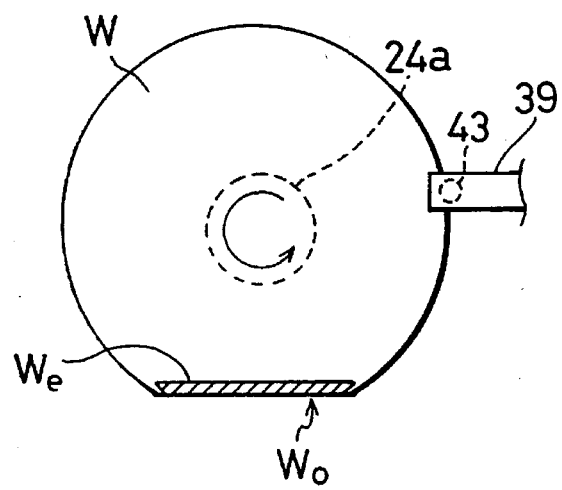
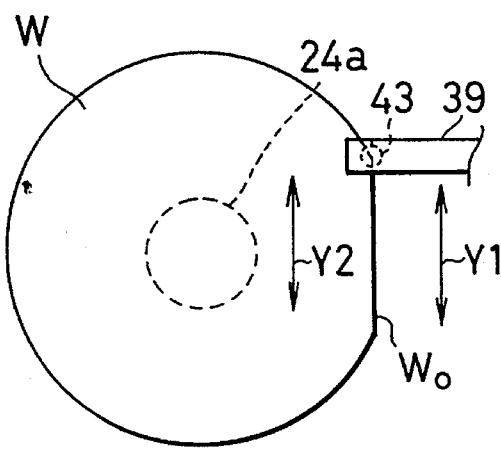
FIG.17
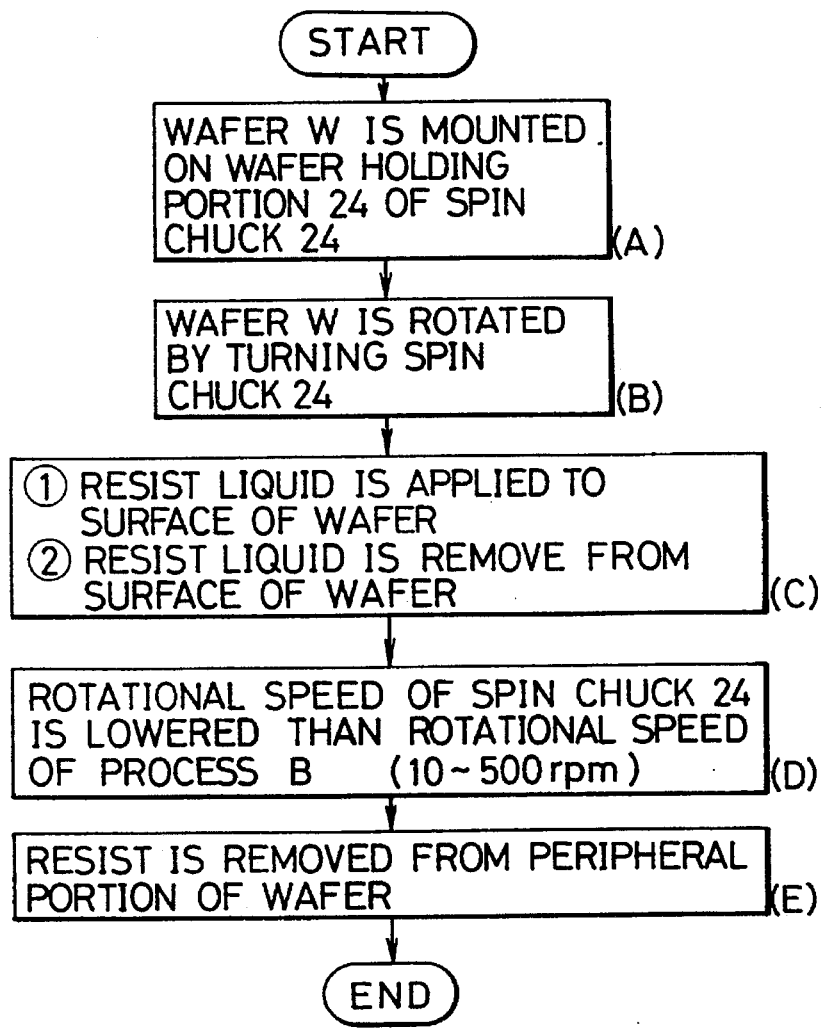

APPARATUS FOR REMOVING PROCESS LIQUID

BACKGROUND OF THE INVENTION

A. Field of the Invention

The present invention relates to a processing apparatus for coating the surfaces of articles to be processed such as semiconductor wafers or LCD substrates with a processing liquid such as a resist liquid, and more particularly to a resist processing apparatus having a function for removing unnecessary coated films formed on the peripheral portions of the articles. The present invention also relates to a method of performing resist processing.

B. Description of the Related Art

With a method of manufacturing semiconductor apparatuses or the like, the surfaces of articles to be processed such as semiconductor wafers are coated with a processing liquid by rotating the articles or spraying the processing liquid on the articles. In the process of this kind, the thickness of each film is uniform just after the process. However, as the time elapses, the processing liquid swells and becomes thick at the peripheral portion of each article to be processed by the surface tension, and the processing liquid extends to the peripheral portion of the undersurface of the article, thereby forming unnecessary films.

When such nonuniform resist films are formed on the peripheral portion of the processed article, they are not removed completely from the peripheral portion of the article but are left on it. During the transportation of the articles after they have been processed, the retained resist is likely to peel off, resulting in generation of particles.

In order to solve this problem, the unnecessary coated films must be removed from the peripheral portion of each article to be processed after the surface of the article has been coated with the resist liquid or the like.

An apparatus for removing unnecessary coated films from the peripheral portion of each processed article is disclosed in Japanese Examined Patent Application Publication No. 3-76777.

The removing apparatus comprises upper and lower supplying pipes of a washing liquid provided so as to face the upper surface and the undersurface of the peripheral portion of a wafer and an exhaust pipe disposed between the upper and lower supplying pipe, for collecting the used washing liquid supplied from the supplying pipes. The washing liquid is supplied from the supplying pipes to the wafer and is sucked by the exhaust pipe simultaneously. The removing apparatus forcibly exhausts all the washing liquid and dissolved substances through the exhaust pipe to prevent the washing liquid from flowing toward the center of the wafer.

However, this removing apparatus has such a structure that two supplying pipes are used to supply a washing liquid to the upper surface and the undersurface of each wafer. The washing liquid supplying systems are complicated and increase the manufacturing cost of the removing apparatus. Further, as two washing liquid supplying systems are required, the size of the removing apparatus is large. Because a great amount of washing liquid is supplied from the two washing liquid supplying systems, the running cost of the removing apparatus increases. Since the washing liquid is supplied to the upper surface and the undersurface of the peripheral portion of each wafer and the used washing liquid is collected by the exhaust pipe disposed between the supplying pipes and extending perpendicularly to them, the washing liquid is not supplied to the vertical edge of the peripheral portion of the wafer, and it is difficult to remove the unnecessary coated films completely.

SUMMARY OF THE INVENTION

The present invention was made to overcome the defects of the conventional art. The first object of the present invention is to provide a processing apparatus which has a simplified washing liquid supplying apparatus and has a function of removing unnecessary coated films by a small amount of a washing liquid. The second object of the present invention is to provide a resist processing apparatus and a resist processing method which effectively removes coated films from the peripheral portion of each article to be processed even when the article is not circular.

According to one aspect of the present invention, a resist processing apparatus for coating the upper surface of each of articles to be processed comprises:

a washing nozzle for jetting a washing liquid to the peripheral portion of the undersurface of the article to be processed at a predetermined angle; and collecting means for collecting the washing liquid from the upper surface of the article at another predetermined angle.

According to another aspect of the present invention, a resist processing method comprises the steps of:

coating the upper surface of each of articles to be processed with a resist liquid while the article is being rotated; and supplying a washing liquid to the peripheral portion of the undersurface of the article at a predetermined angle and at the same time collecting the washing liquid from the upper surface of the article at another predetermined angle after the step of the coating.

Provision of the washing nozzle for jetting the washing liquid to the peripheral portion of the undersurface of each article at a predetermined angle and the collecting means for collecting the washing liquid from the upper surface of the article at another predetermined angle allows the washing liquid to remove a coated film formed on the peripheral portion of the undersurface of the article. The washing liquid reaches the upper surface of the article through the peripheral edge of the article by its own viscosity and an air flow produced by the collecting means and removes a coated film formed on the peripheral portion of the upper surface of the article. The washing liquid used for removing the coated films and substances dissolved from them are sucked by the collecting means, and the washing liquid is exhausted or recovered. The width of the coated film to be removed from the upper surface of the article is adjusted by properly regulating the amount of flow of the washing liquid and/or the sucking amount of the collecting means due to the viscosity and the centrifugal force of each of the articles to be processed while the article is being rotated. The unnecessary coated films formed on the upper surface and the undersurface of the peripheral portion of the article can be removed by supplying the washing liquid from the washing nozzle provided at the undersurface of the article, and the removal of the coated film formed on the vertical edge of the peripheral portion of the article is ensured. Further, the simplified washing liquid supplying system for supplying the washing liquid to the washing nozzle can reduce the amount of the washing liquid supplied to the article to be processed.

BRIEF DESCRIPTION OF THE DRAWINGS

FIGS. 16A and 16B are general plan views of another embodiment by which an article to be processed is processed;

FIG. 17 is a general flow chart showing how to process an article to be processed;

DETAILED DESCRIPTION OF THE PREFERRED EMBODIMENTS

The preferred embodiments of the present invention will be described with reference to the accompanying drawings.

Figure 1:
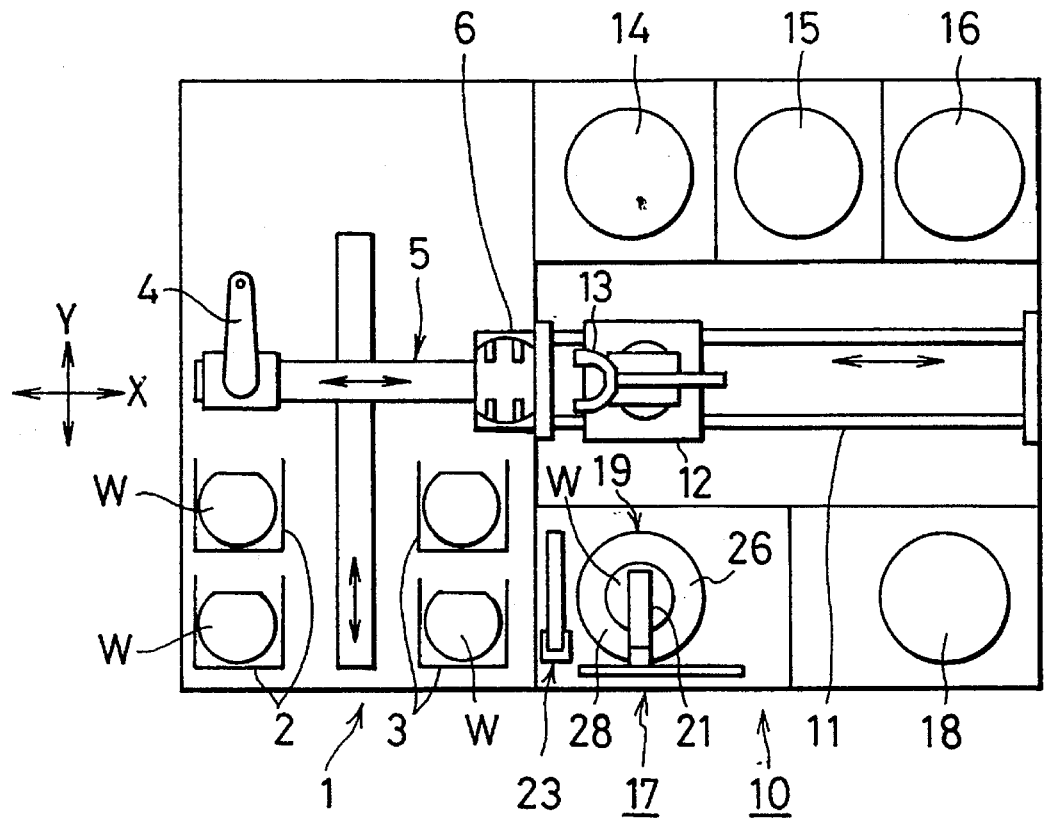
FIG. 1 is a general plan view of a resist processing apparatus according to one embodiment of the present invention.

FIG. 1 is a general plan view of a resist processing apparatus according to one embodiment of the present invention.

As shown in FIG. 1, the resist processing apparatus mainly comprises a processing unit section 10 having a plurality of processing units for processing articles to be processed such as wafers W (hereinafter referred to as the "wafers W") in various ways, and a transporting unit section 1 for automatically transporting the wafers W to and from the processing unit section 10.

On the transporting unit section 10 are mounted first wafer carriers 2 for housing wafers W before being processed and second wafer carriers 3 for housing the wafers W after having been processed. The transporting unit section 10 further comprises an arm 4 for sucking and holding a wafer W and a moving mechanism 5 for moving the arm 4 in the X directions and the Y directions (the horizontal directions), in the Z directions (the vertical directions) and in the θ directions (the rotational directions), and an alignment stage 6 for aligning the wafer W, for example, setting the center of the wafer W to the predetermined position and sending the wafer W to and receiving the same from the processing unit section 10.

The processing unit section 10 comprises a transporting passage 11 extending in the X direction from the alignment stage 6 and a transporting mechanism 12 movable along the straight transporting passage.

The transporting mechanism 12 has a main arm 13 movable in the Y, Z and θ directions.

At one side of the transporting passage 11 are provided an adhering unit 14 for performing adhesion to improve sealing between wafers W and resist liquid films, a prebaking unit 15 for heating and evaporating a solvent residing in a resist film with which the wafer W is coated, and a cooling unit 16 for cooling the heated wafers W.

At the other side of the transporting passage 11 are provided a processing liquid coating unit 17 for applying the processing liquid to the surface of the wafer W, and a surface coating layer applying unit 18 for applying a CEL layer or the like to the resist to the wafer W.

There will be described the steps how the wafer W is transported on the so constructed resist processing apparatus.

First, the moving mechanism 5 of the transporting unit section 1 is driven, and the wafer W before being processed is moved by the arm 4 from one of the first carriers to the alignment stage 6.

Then, the wafer W on the alignment stage 6 is held by the main arm 13 of the transporting mechanism 12, and is transported in turn to the predetermined processing units 14 to 18 according to the predetermined processes.

The wafer W after having been processed by the required ones of the processing units 14 to 18 is transported to the alignment stage 6 by the main arm 13. Then, the wafer W after being processed is housed in the predetermined position of the second wafer carrier 3. In this way, the transportation of the wafer W is completed.

The structure of the processing liquid coating unit 17 will be described with reference to the drawings.

Figure 2:
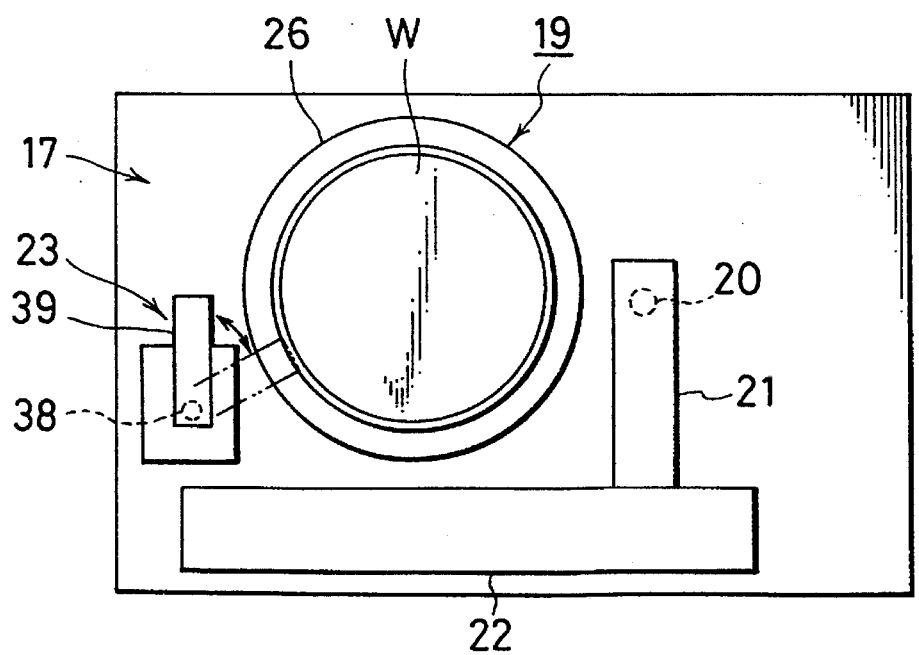
FIG. 2 is a general plan view of a processing liquid coating mechanism of the resist processing apparatus of FIG. 1.

As shown in FIGS. 1 and 2, the processing liquid coating unit 17 mainly comprises a processing portion 19 for coating the wafer W with the processing liquid, a nozzle 20 movable over the processing portion 19 and supplying a resist liquid as a processing liquid to the surface of the wafer W, a nozzle transporting arm 21 for moving the nozzle 20 between the position over the wafer W and its waiting position, a transporting mechanism 22 of the transporting arm 21, and a coated film removing mechanism 23 provided in a vicinity of the processing portion 19.

Figure 3:
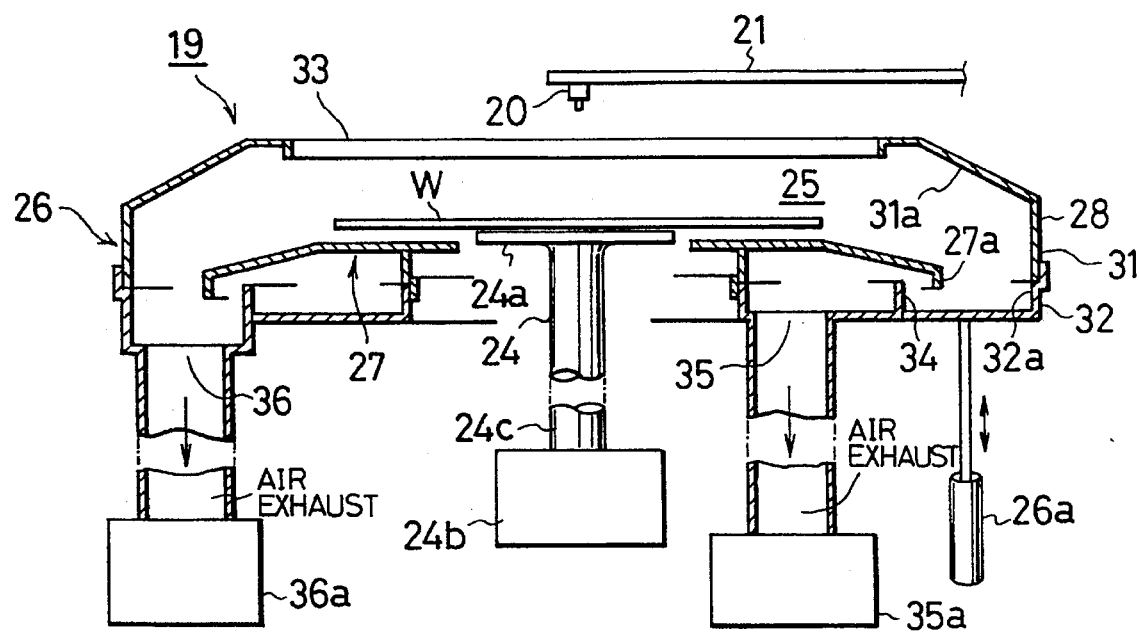
FIG. 3 is a general longitudinal cross-sectional view of the processing liquid coating mechanism.

As shown in FIG. 3, the processing portion 19 comprises a spin chuck 24 for holding the wafer W by suction and rotating the wafer W in a horizontal plane, and a processing cup 26 for holding the wafer holding portion 24a of the spin chuck 24.

The lower end of the spin chuck 24 is fixed to the rotary shaft 24c of a motor 24b for rotating the wafer W at a predetermined high rotational speed.

Figure 4:
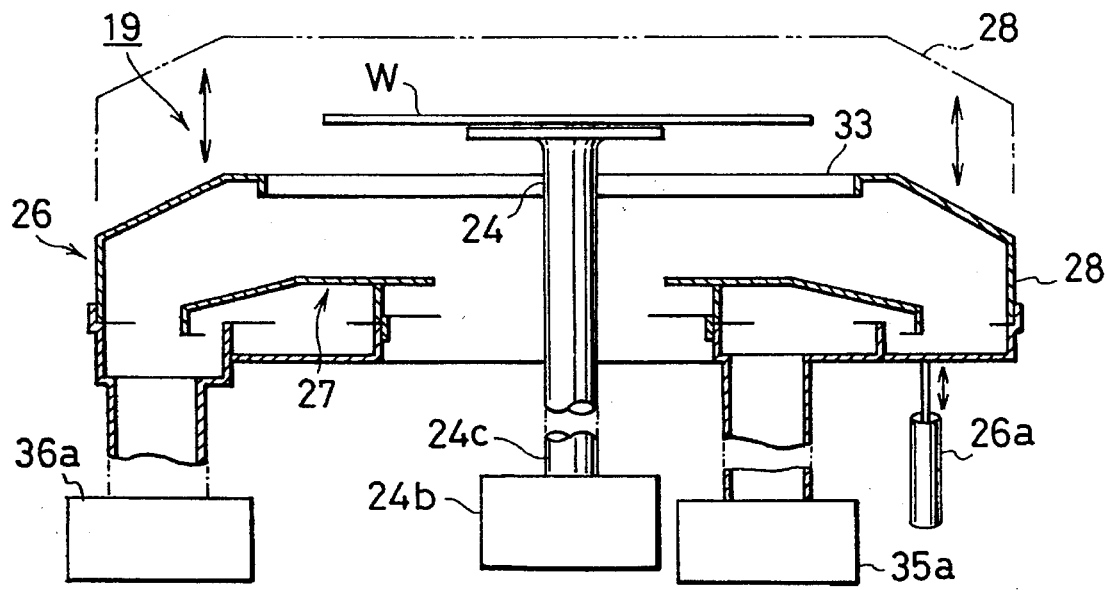
FIG. 4 is another general plan longitudinal cross-sectional view of the processing liquid coating mechanism.

The processing cup 26 comprises an annular inner cup 27 coaxially surrounding the holding portion 24a of the spin chuck 24 and an outer cup 28 housing the spin chuck 24 and the inner cup 27 and defining a processing space 25. The processing cup 26 is lifted and lowered by a lifting mechanism 26a, as shown in FIG. 4.

The outer cup 28 comprises an upper cup section 31 and a lower cup section 32 fitted with each other at their lateral walls. An opening 33 having a slightly larger diameter than that of the wafer W is formed in the central portion of the upper cup section 31, and the side wall of the upper cup section 31 ranging from the vicinity of the opening 33 to the vicinity of the joining portion to the lower cup section 32 inclines outward downward.

The interior of the lower cup section 32 is divided by an annular wall 34 into an outer portion and an inner portion. The inner wall of bottom of the inner portion is formed with an air exhaust port 35, and the outer wall of the bottom of the inner portion is provided with a liquid exhaust port 36.

A vacuuming device 35a is connected to the exhaust port 35 so that particles and a resist liquid scattered upon processing the wafer W, as well as the atmosphere in the processing liquid coating unit 17, can be exhausted from the exhaust port 35.

An exhausted liquid tank 36a is connected to the liquid exhaust port 36 and contains, through the exhaust port 36, the resist liquid or the like which is lowered and accumulated in the bottom of the lower cup 32 through the inner faces 31a and 32a of the outer cup 28 and the upper face 27a of the inner cup 27. The resist liquid, vaporized substances and particles are separated into gases and a liquid to be exhausted by the vacuuming device 35a and the exhausted liquid tank 36a.

Figure 5:
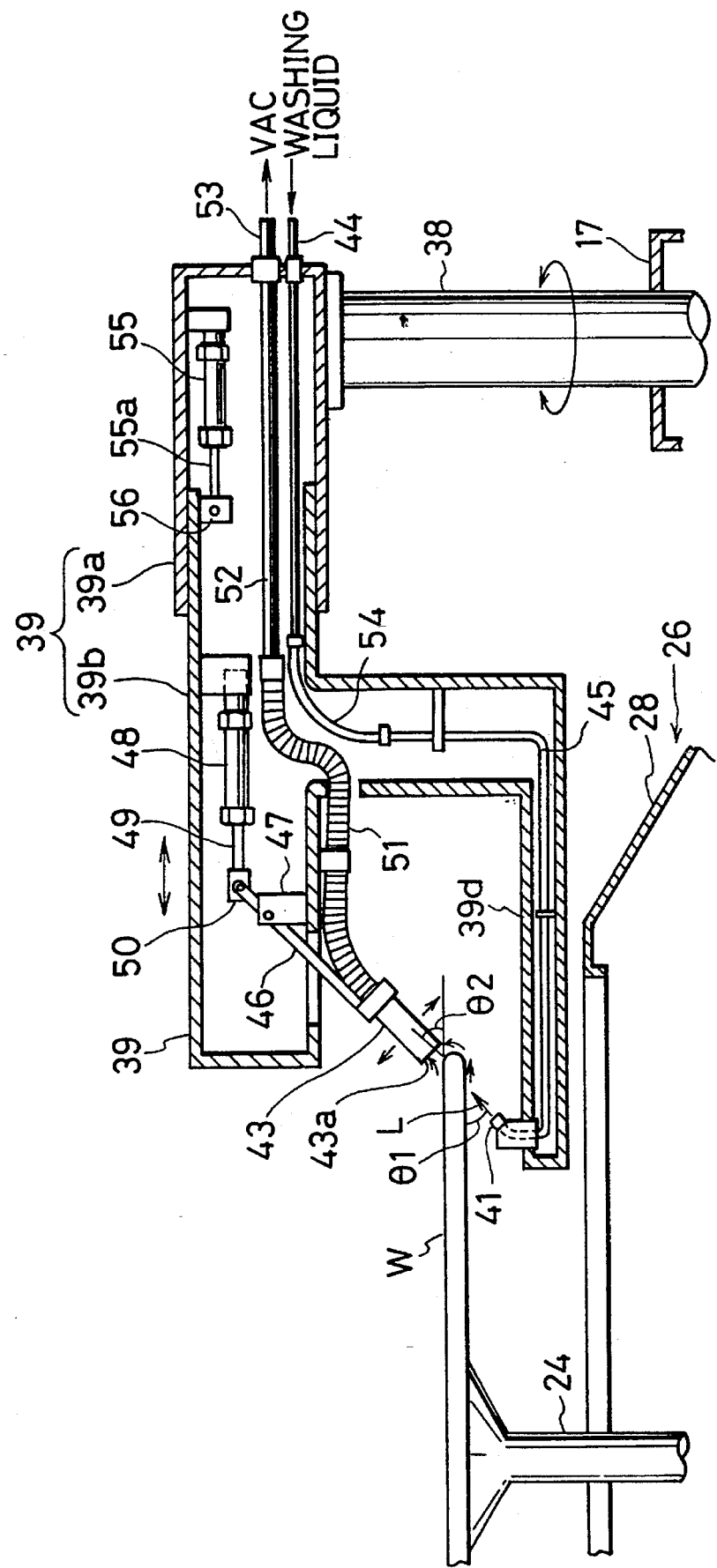
FIG. 5 is a longitudinal cross-sectional view of a coated film removing mechanism of the resist processing apparatus.

As shown in FIGS. 2 and 5, the coated film removing mechanism 23 mainly comprises an arm 39 horizontally supported and having an end fixed to the front end portion of a rotary shaft 38 projecting vertically upward from the inside of the processing liquid coating unit 17, a washing nozzle 41 provided on the front end portion of the arm 39 and an exhaust pipe 43.

The arm 39 comprises a proximal end member 39a fixed to the rotary shaft 38 and a distal end member 39b axially slidably fitted in the front end portion of the proximal end member 39a. The distal end member 39b comprises an upper portion 39c disposed coaxially with the proximal end member 39a and a lower portion 39d extending downward from an intermediate portion of the upper portion 39c, bent into an L-shape and extended forward. As shown in FIG. 4, the inner cup 27 and the outer cup 28 are positioned lower than the wafer W so as to rotate the arm 39 toward the wafer W (FIG. 2). Then, the front end portion of the upper portion 39c is disposed above the wafer W held on the spin chuck 24, and the front end portion of the lower portion 39d is inserted in a space defined between the undersurface of the wafer W and the upper surface of the outer cup 28.

The washing nozzle 41 provided on the front end of the lower portion 39d jets a washing liquid L in the vicinity of the peripheral portion of the undersurface of the wafer W at a predetermined angle θ1.

It is preferred that the washing liquid L have the same components as a solvent contained in the resist liquid applied to the surface of the wafer W. In other words, the resist liquid comprises a solvent, resin and a photosensitive group, and the components of the solvent vary with the components of the resin and/or the photosensitive group. Thus, it is necessary to change the components of the washing liquid L in accordance with the components of the resist liquid.

The jet angle θ1 of the washing liquid L from the washing nozzle 41 is set to a predetermined value at which the washing liquid L is less likely to be defected off of the undersurface of the wafer W due to the viscosity or wettability of the washing liquid to be used, and preferably 60° to 80°.

Figure 6:
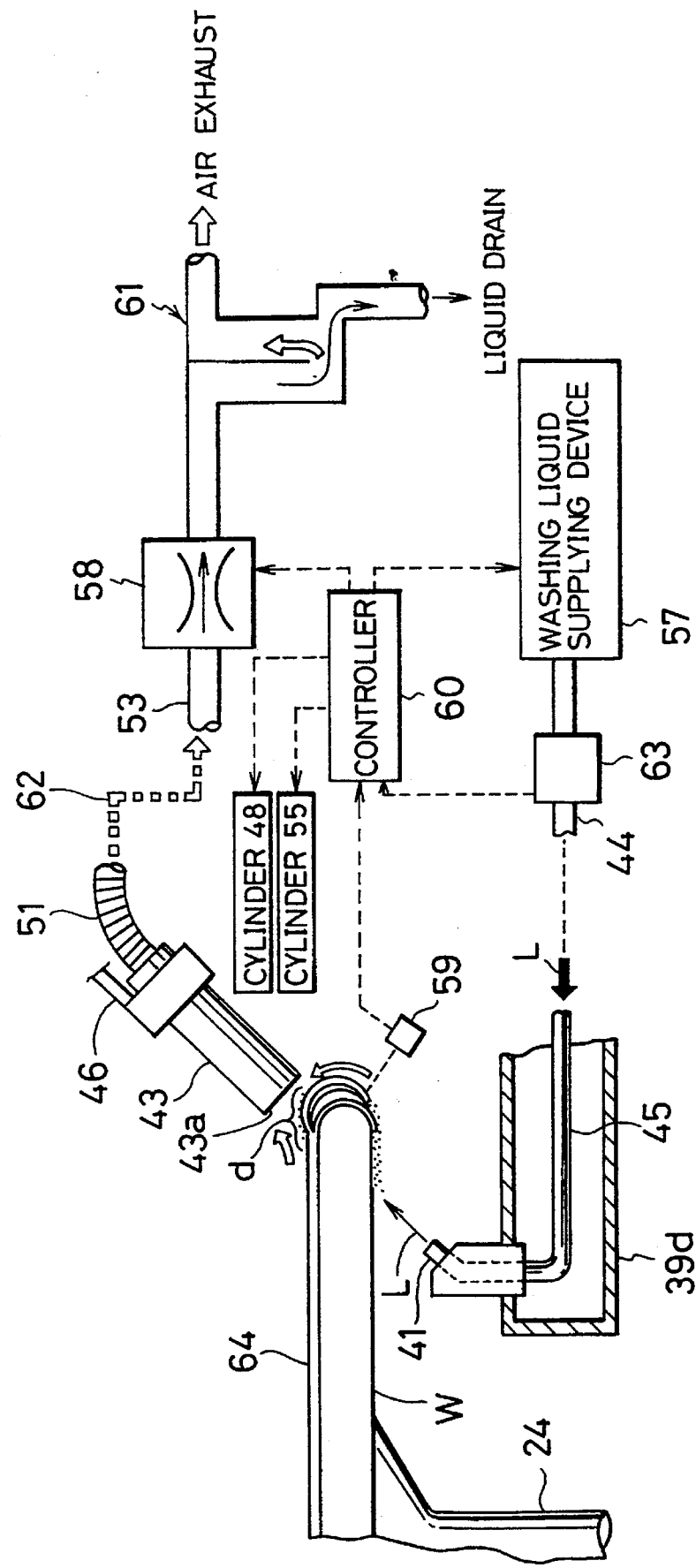
FIG. 6 is a partially broken side view showing a structure of a washing liquid supplying system and an exhausting system.

A washing liquid supplying pipe 45 for supplying the washing liquid L to the washing nozzle 41 extends through the arm 39 and is connected to an end of the distal end member 39a and is also connected to a washing liquid supplying device 57 by a connecting pipe 44, as shown in FIG. 6.

An intermediate portion of the washing liquid supplying pipe 45 forms a flexible pipe portion 54.

The exhaust pipe 43 extends downward from the undersurface of the front portion of the upper portion 39c and is fixed to a vertically swingable link 46. The suction port 43a of the exhaust pipe 43 is disposed to face the upper surface of the peripheral portion of the wafer W in an outward inclined state so as to suck an exhaust liquid from the wafer W.

The swingable link 46 has an intermediate portion pivotally connected to a bracket 47 fixed to the inner wall of the bottom of the upper portion 39c.

On the ceiling of the upper portion 39c is provided an air cylinder 48 for rotating the swingable link 46. The upper end portion of the swingable link 46 is connected to a bracket 50 fixed to the front end of the cylinder rod 49 of the air cylinder 48.

The cylinder rod 49 is extended or shrunk by driving the air cylinder 48 to rotate the swingable link 46 vertically. Then, the angle θ2 of the exhaust pipe 43 of the collecting means of the washing liquid L can be adjusted.

The angle θ2 of the exhaust pipe 43 is set to a predetermined value at which the washing liquid L is effectively collected depending on the washing liquid jetting angle θ1 of the washing nozzle 41, preferably 45° to 80°.

The exhaust pipe 43 is connected to an end portion of the proximal end member 39a by an exhaust pipe 52 having an intermediate portion formed as a flexible pipe and is further connected to an ejector 58 which is a suction device by a connecting pipe 53 as shown in FIG. 6. To the ceiling of the proximal end member 39a is fixed an air cylinder 55 for reciprocating the distal end member 39b. The front end of the cylinder rod 55a of the air cylinder 55 is connected to a bracket 56 fixed to the distal end member 39b.

The cylinder rod 55a is extended or shrunk by driving the air cylinder 55 to reciprocate the distal end member 39b horizontally. Then, the positions of the washing nozzle 41 and the exhaust pipe 43 with respect to the wafer W can be adjusted.

As shown in FIG. 6, a sensor 59 for detecting the position of the peripheral portion of the wafer W is provided at a position close to the wafer holding position of the spin chuck 24. Detected signals from the sensor 59 is input to a controller 60.

The controller 60 drives the cylinder 55 according to the detected signal from the sensor 59 to reciprocate the distal end member 39b of the arm 39 so that the washing nozzle 41 and the exhaust pipe 43 are properly positioned with respect to the wafer W. Thereafter, the angle of exhaust pipe 43 is properly adjusted by driving the cylinder 55 and rotating the swingable link 46. The amount of supply of the washing liquid L by the washing liquid supplying device 57 and the adjustment of the suction force of the exhaust pipe 43 by the ejector 58 are previously programmed.

This program is made so that the width d of the coated film 64 removed from the peripheral portion of the wafer W is set to a predetermined value, preferably not more than 5 mm, i.e., less than approximately 5 mm (equal to or less than 5 mm), and more preferably not more than (equal to or less than, or maximum) 3 mm by considering the viscosity of the washing liquid L and the rotational speed of the wafer W. On an intermediate portion of the pipe 44 for supplying the washing liquid L to the washing nozzle 41 is provided a flow sensor 63 for detecting the amount of flow of the washing liquid L and supplying the detected signals to the controller 60. A gas-liquid separator 61 is provided on the discharge pipe of the ejector 58. A fluid 62 which is delivered from the exhaust pipe 43 and in which gases and liquids are mixed with each other is separated into gases and liquids and collected.

In the processing liquid coating mechanism 17 as described above, the arm 39 of the coated film removing mechanism 23 is at the waiting position which is close to the processing cup 26 while the surface of the rotating wafer W is being processed, as shown by the solid lines in FIG. 2.

The processing cup 26 is lowered after having coated the wafer W, and then the distal end member 39b of the arm 39 is moved to the position close to the wafer W by rotating the arm 39, as shown in FIG. 5.

Immediately after the movement of the distal end member 39b of the arm 39, the position of the peripheral portion of the wafer W is detected by the sensor 59, and the cylinders 48 and 55 are driven by controlling the controller 60 to move the distal end member 39b of the arm 39 and to rotate the swingable link 46. Then, the washing nozzle 41 and the exhaust pipe 43 are properly positioned and the angle of the exhaust pipe 43 is properly adjusted.

Thereafter, as soon as the driving of the spin chuck 24 is initiated, the washing liquid supplying device 57 and the ejector 58 are driven by regulating the controller 60 to initiate the jetting of the washing liquid L from the washing nozzle 41 to a predetermined position close to the peripheral portion of the undersurface of the wafer W and the suction of the washing liquid L by the exhaust pipe 43. The jet speed of the washing liquid L is set to a predetermined value.

As shown in FIG. 6, the washing liquid L jetted from the washing nozzle 41 is guided to the peripheral portion of the wafer W by the jetting force of the washing liquid L and the centrifugal force of the rotating wafer W to remove the coated film formed on the peripheral portion of the undersurface of the wafer W. By the viscosity of the washing liquid L itself and an air flow produced by the exhaust pipe 43, the washing liquid L flows from the undersurface of the wafer W and passes the peripheral edge of the wafer W. Thereafter, the washing liquid L reaches the upper surface of the wafer W and removes the coated film on the peripheral edge of the wafer W and the predetermined width d of the coated film on the peripheral portion of the upper surface of the wafer W.

The washing liquid L which was used to remove the coated films and substances dissolved from the washing liquid L are sucked by the exhaust pipe 43 connected to an exhaust pump and delivered to the gas-liquid separator 61 through the pipes 51, 53 and 58. They are separated into gases and liquids and collected so that they do not flow in the exhaust pump.

In this way, unnecessary coated films can be removed from the upper surface and the undersurface of the wafer W by supplying the washing liquid L from the washing nozzle 41 provided at the undersurface of the wafer W. This structure simplifies the washing liquid supplying system and reduces the amount of the washing liquid to be used.

Figure 7:
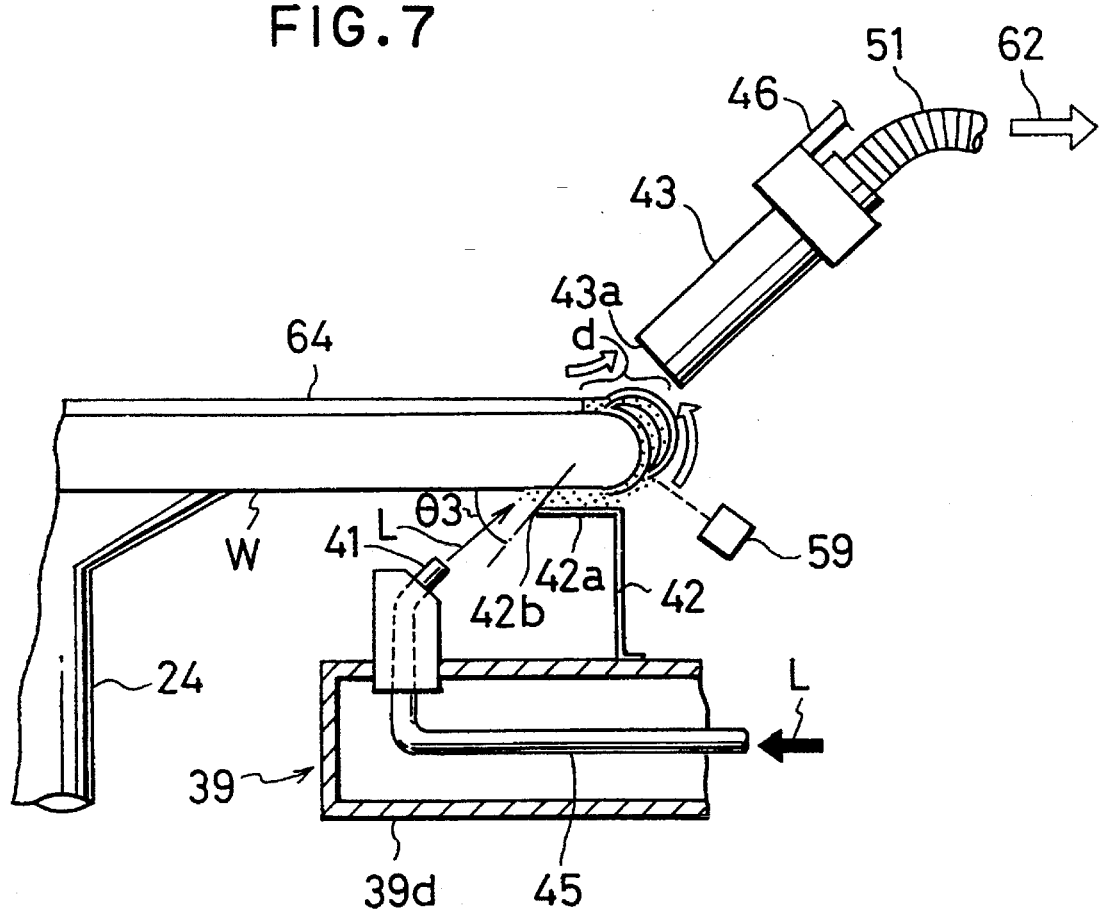
FIG. 7 is a longitudinal cross-sectional view of another embodiment of the coated film removing mechanism.

Another embodiment of the coated film removing mechanism 23 will be described with reference to FIG. 7.

In this embodiment, the arm 39 is provided with a guide plate 42 for guiding the washing liquid L toward the peripheral portion of the wafer W by receiving the washing liquid L in a space defined between the upper surface of the guide plate 42 and the undersurface of the wafer W.

The guide plate 42 is erected on the upper surface of the lower member 39d of the arm 39, and the upper end portion 42a of the guide plate 42 extends to a position very close to the undersurface of the peripheral portion of the wafer W. The height of the upper end portion 42a is set so that the distance between the upper end portion 42a and the wafer W is preferably not more than 5 mm, i.e., maximum 5 mm. The upper portion 42a is bent substantially perpendicularly and extends horizontally toward the washing nozzle 41. The extended front portion 42b of the upper portion 42a is slightly bent downward so that the washing liquid L easily flows into the space between the undersurface of the wafer W and the upper end portion 42a. The bent angle θ3 is preferably substantially the same as the jet angle θ1 of the washing liquid L from the washing nozzle 41 or more.

The washing liquid L jetted from the washing nozzle 41 is received in the space between the upper surface of the guide plate 42 and the undersurface of the wafer W and is guided to the peripheral edge of the wafer W by the force of the jet and the centrifugal force of the wafer W.

The provision of the guide plate 42 securely prevents the washing liquid L from splashing at the undersurface of the wafer W and forms stable planar flow of the washing liquid L. Thus, the washing liquid L effectively removes the coated films on the peripheral portion of the wafer W.

The washing nozzle 41 and the guide plate 42 are fixed to the common arm 39 in this embodiment. When there is an ample space in the processing cup 26 and the resist coating process, which is the primary function, is not disturbed, the washing nozzle 41 and the guide plate 42 may be permanently provided in the processing cup 26, and the exhaust pipe 43 may be moved in the processing cup 26. In this case, the processing cup 26 need not be lowered.

Figure 8:
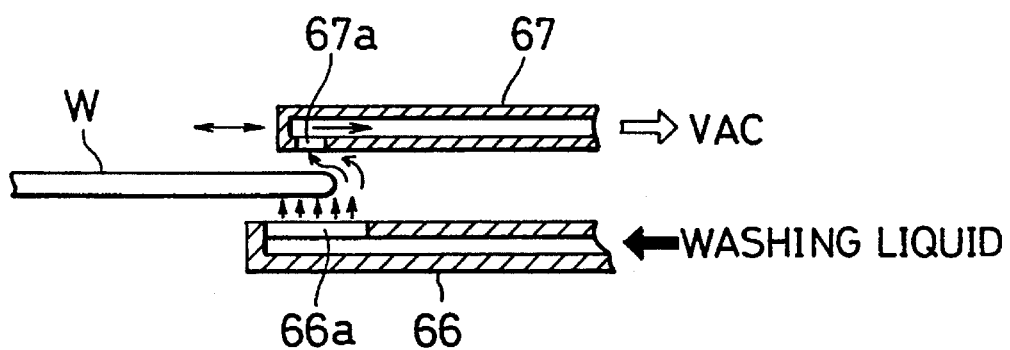
FIG. 8 is a longitudinal cross-sectional view of another embodiment of the washing nozzle of the coated film removing mechanism.

Another embodiment of an outlet 66a of the washing nozzle 66 will be described with reference to FIG. 8. The outlet 66a is formed as a slit extending in the radial direction of the wafer W. The amount of the washing liquid L which has reached the upper surface of the wafer W is adjusted by regulating the position of the suction port 67a of an exhaust pipe 67. This structure allows the washing liquid L to be stably supplied to the peripheral portion of the wafer W without using a guide plate 42.

Figure 9A:
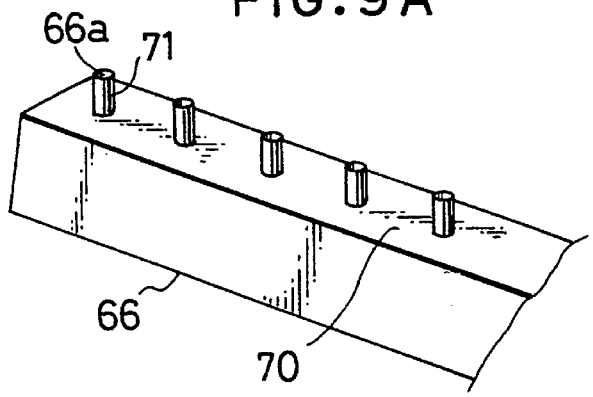
FIGS. 9A and 9B are perspective views of further embodiments of the washing nozzles of the coated film removing mechanisms.

A further embodiment of an outlet 66a of the washing nozzle 66 will be described with reference to FIG. 9A. The outlet 66a is formed in each of a plurality of supporting members 71 provided on a surface 70 of the washing nozzle 66 at the side of the wafer W. The supporting members 71 are arranged side by side in a radial direction of the wafer W. The amount of the washing liquid L which reaches the upper surface of the wafer W can be adjusted by regulating the positions of the suction ports 67a of the exhaust pipe 67 (FIG. 8). This structure allows the washing liquid L to be stably supplied to the peripheral portion of the wafer W. The washing liquid L can be effectively supplied to the undersurface of the wafer W by gradually narrowing or broadening the distances between the adjacent supporting members 71 from the inside portion of the undersurface of the wafer W toward its peripheral edge. The supporting members 71 may be provided perpendicularly to the wafer W or may be inclined at a predetermined angle from the wafer W to supply the washing liquid L to the undersurface of the wafer W effectively.

Figure 9B:
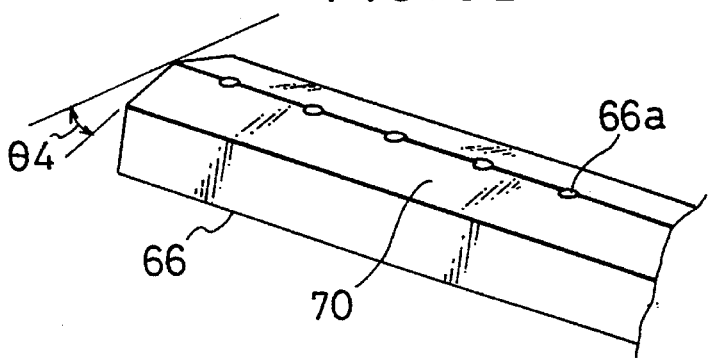

A still further embodiment of an outlet 66a of the washing nozzle 66 will be described with reference to FIG. 9B. The outlets 66a are formed in the substantially central portions of a roof-shaped surface 70 of the washing nozzle 66 at the side of the wafer W. The roof-shaped surface 70 comprises two surface portions disposed on both sides of the central portion and inclining at an angle θ4.

This arrangement enables the washing liquid L which was jetted from the outlets 66a and splashed by the undersurface of the wafer W to be exhausted, as it passes the inclined surface portions of the surface 70 of the washing nozzle 66 on both sides of the row of the outlets 66a. In particular, the washing liquid L splashed by the undersurface of the wafer W includes the components of the resist layer. Thus, the splashed washing liquid L must not be mixed with the clean washing liquid L jetted from the outlets 66a. The roof-shaped surface 77 prevents this mixture. This structure permits the washing liquid L from being supplied to the peripheral portion of the wafer W stably without using a guide plate 42.

The washing liquid L can be effectively supplied to the undersurface of the wafer W by gradually narrowing or broadening the distances between the adjacent outlets 66a from the inside portion of the undersurface of the wafer W toward its peripheral edge.

Figure 10A:
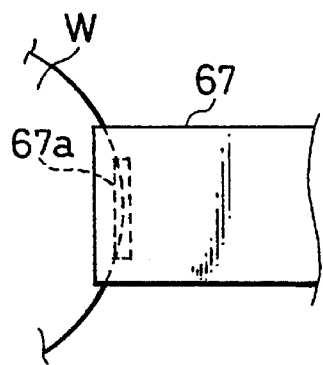
FIGS. 10A to 10C are plan views of embodiments of the suction ports of the coated film removing mechanisms.

Other embodiments of suction ports 67a of the exhaust pipe 67 will be described with reference to FIGS. 10A to 10C. The suction port 67a as shown in FIG. 10A comprises a slit extending in a direction perpendicular to a radial direction of the wafer W. Since the range of the suction port 67a in which the washing liquid L reaching the upper surface of the wafer W is large, the washing liquid L which happens to be splashed by the peripheral edge of the wafer W in a region outside of the washing liquid supplying position and would become particles is collected well and can prevent generation of particles.

Figure 10B:
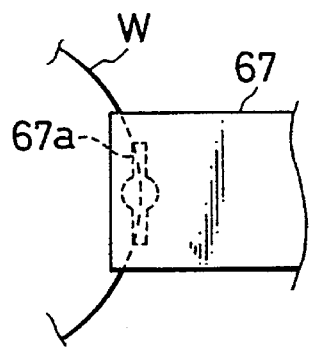
Figure 10C:
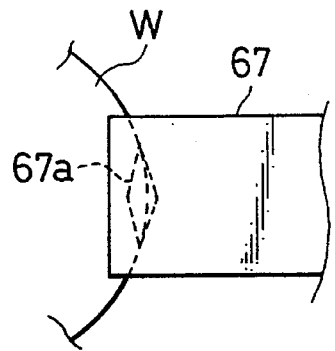

The suction port 67a as shown in FIG. 10B comprises a slit extending in a direction perpendicular to a radial direction of the wafer W and a circular suction hole formed in the central portion of the slit. With this structure, the suction force of the central portion is made larger than the other regions of the slit. By doing so, the central portion of the suction port 67a concentratedly collects the washing liquid L and the removed range of the unnecessary portion of the resist film formed on the wafer W can be limited. In order to attain the same effect as the suction port of FIG. 10C, the suction portion 67a may be formed into a rhombic shape as shown in FIG. 10C.

Figure 11:
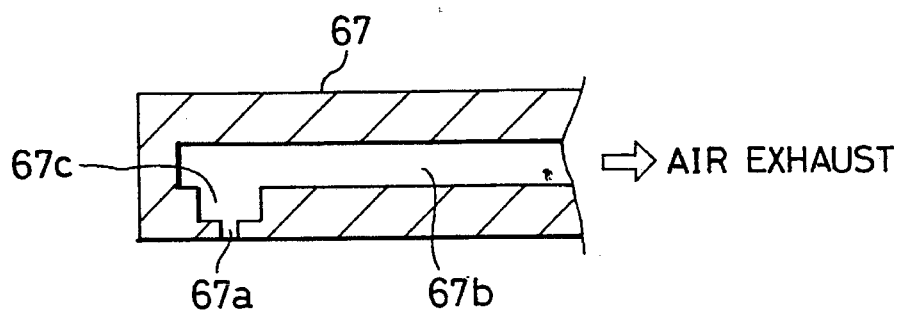
FIG. 11 is a longitudinal cross-sectional view of another embodiment of the suction port of the coated film removing mechanism.

FIG. 11 shows an embodiment of the exhaust pipe 67 in which the suction efficiency at the suction port 67a is increased. In the exhaust pipe 67 are formed an exhaust passage 67b, a depression 67c having a smaller cross section than that of the exhaust passage 67b and communicating therewith, and a suction port 67a having a smaller cross section than that of the depression 67c. Since the open area of the suction port 67a is smaller than the cross-sectional area of the exhaust passage 67b, the suction force can be increased.

Figure 12:
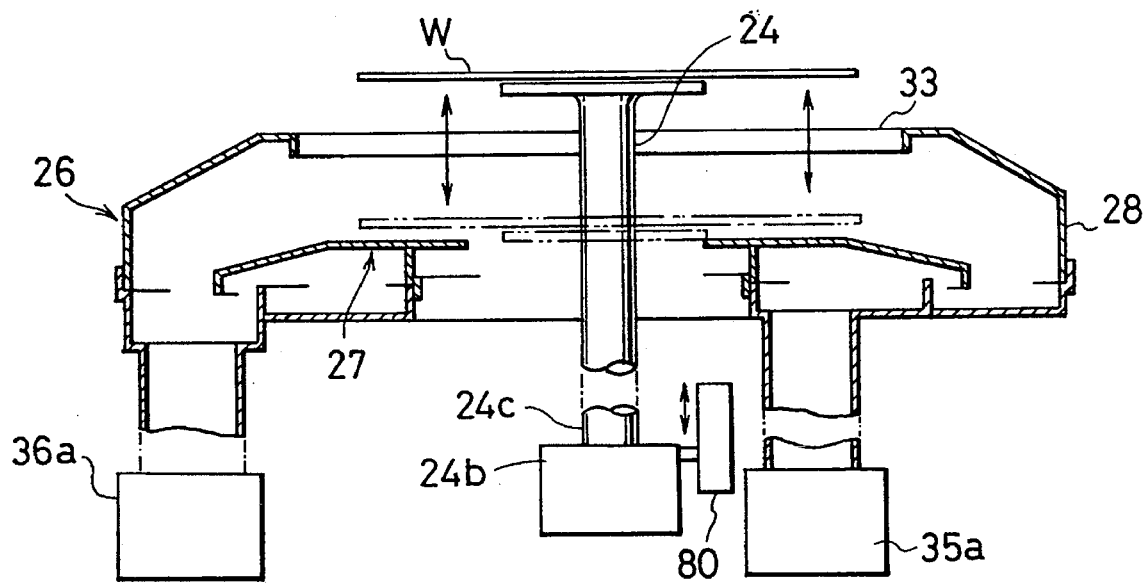
FIG. 12 is a longitudinal cross-sectional view of another embodiment of the processing liquid coating mechanism, whose lifting mechanism of a processing cup is modified from the embodiment of FIG. 4.
Figure 13:
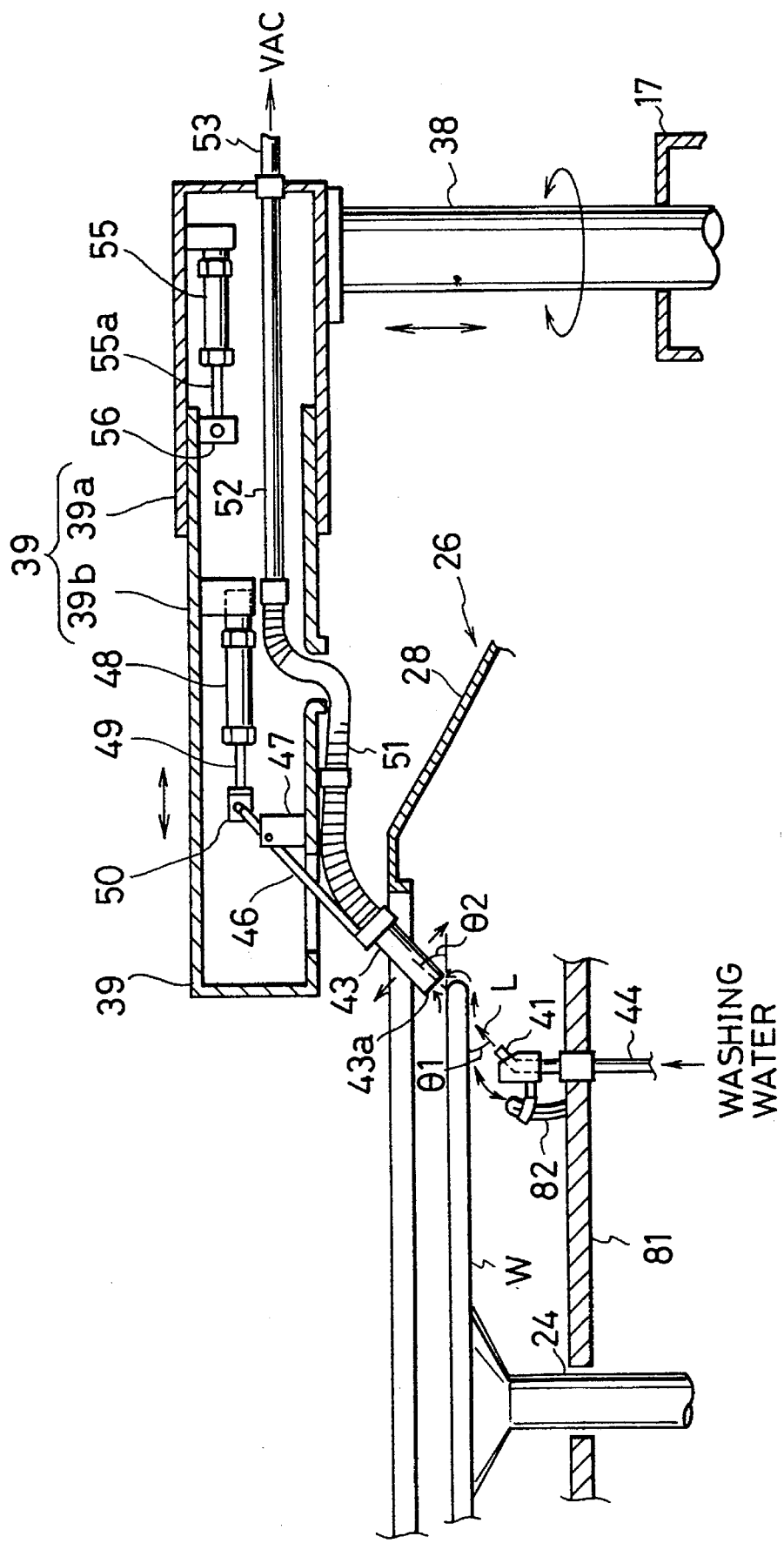
FIG. 13 is a longitudinal cross-sectional view of a further embodiment of the coated film removing mechanism modified from that of FIG. 5.

FIG. 12 shows another embodiment of the processing liquid applying mechanism whose lifting mechanism of a processing cup 26 is modified from that of the embodiment of FIG. 4. In the embodiment of FIG. 4, the processing cup 26 is moved vertically with respect to the wafer W. However, the embodiment of FIG. 12 includes lifting means 80 (such as an air cylinder) for lifting and lowering a spin chuck 24, and a motor 24b connected to the driving shaft of the lifting means 80 so that the processing cup 26 is fixed and the wafer W supported on the spin chuck 24 is moved between the inside position and the outside position of the processing cup 26. The movement of articles to be processed in the processing liquid applying mechanism of FIG. 12 to which the processing cup 26 is fixed is smaller than the movement of the articles to be processed in the processing liquid applying mechanism of FIG. 4 in which the processing cup 26 is moved vertically, whereby generation of particles due to disturbance of air flow or the like is suppressed. Further, the moving mechanism is compact, leading to a small size of the apparatus and reduction of the apparatus cost. FIG. 13 shows another embodiment of the coated film removing mechanism which differs from the embodiment of FIG. 5. In the coated film removing mechanism of FIG. 13, the washing nozzle 41 is provided separately from the exhaust pipe 43. The exhaust pipe 43 is provided on the arm 39 as described above. The washing nozzle 41 is provided in the processing cup 26 and on a fixed member 81 disposed under the wafer W and is connected to adjusting means 82 disposed under the wafer W, for adjusting the jet angle θ1 of the washing liquid L. The exhaust pipe 43 on the arm 39 is movable in the processing cup 26 and can be set in a predetermined wafer washing position in the processing cup 26.

As unnecessary resist on the wafer W can be removed in the processing cup 26, the washing liquid L can be prevented from scattering onto the upper surface of the processing cup 26 or the other processing units. The unnecessary resist films can be removed from the wafer without moving the processing cup 26 after the resist liquid L has been applied to the wafer W. Thus, the throughput of the processing can be improved. Since removal of the unnecessary resist films from the wafer W is attained immediately after the resist coating process, variations of drying of the resist can be suppressed and the yield of the wafers W can also been improved.

Figure 14:
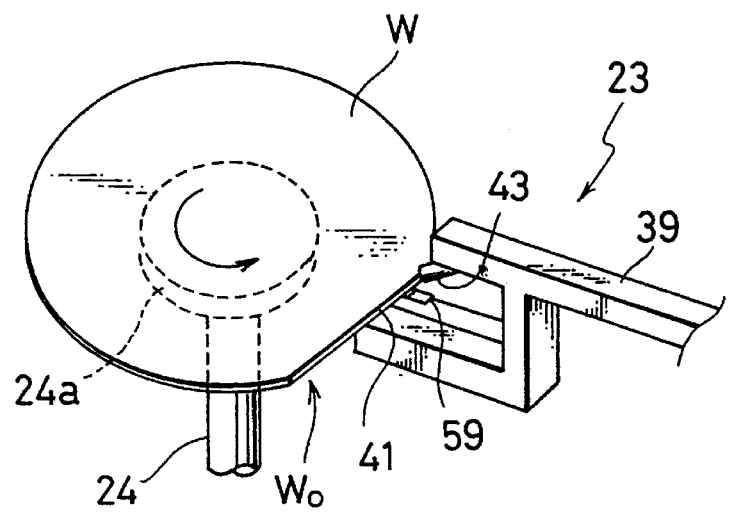
FIG. 14 is a perspective view showing how to process an article to be processed by the coated film removing mechanism.

FIG. 14 is a perspective view showing how to process an article to be processed by the coated film removing mechanism 23. FIGS. 15A to 15D are plan views showing how to process the article to be processed by the coated film removing mechanism 23.

The wafer W is held by the wafer holding portion 24a of the spin chuck 24 and rotated by turning the spin chuck 24.

Figure 15A:
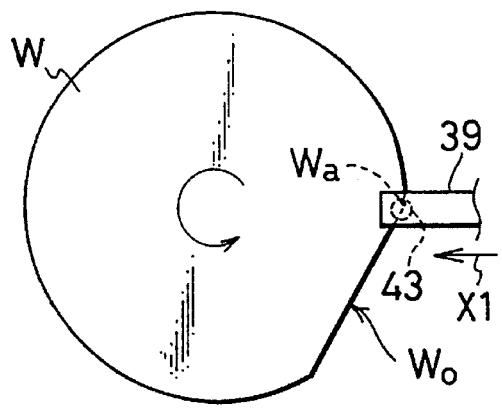
FIGS. 15A to 15D are plan views showing how to process an article to be processed by the coated film removing mechanism.
Figure 15B:
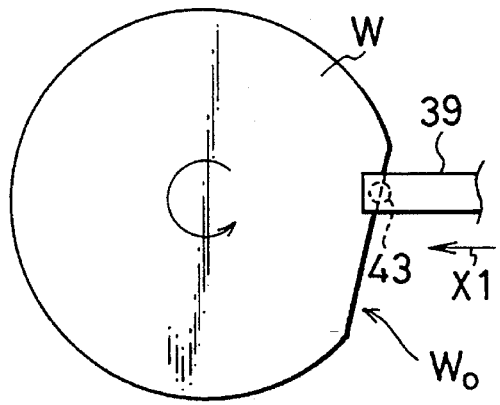
Figure 15C:
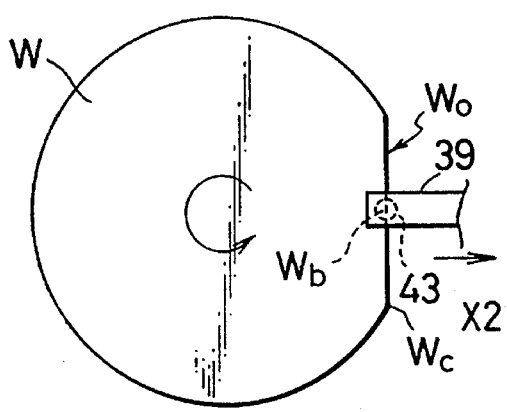
Figure 15D:
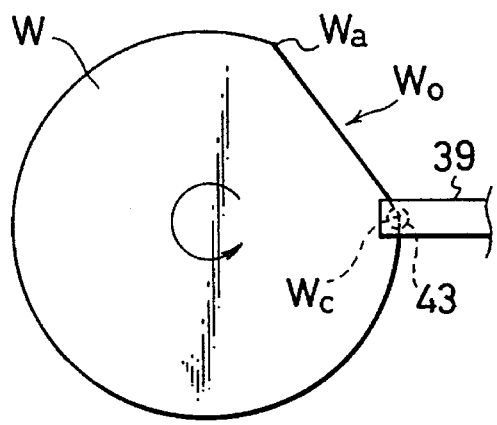

The wafer W is formed with an orientation flat WO. As shown in FIGS. 15A and 15B, when the coated film removing process performed by the coated film removing mechanism 23 starts at one end Wa of the orientation flat WO, the arm 39 is oriented in a predetermined direction with respect to the wafer W. Then, the arm 39 is moved in the direction X1 to perform removing operation as the wafer W is rotated. As the removing operation continues to the central portion Wb of the orientation flat WO, the arm 39 is also oriented in the predetermined direction with respect to the wafer W and is moved in the direction X2 opposite to the direction X1 by rotation of the wafer W to perform removing operation, as shown in FIG. 15C. The removing operation of the orientation flat WO continues to the other end Wc of the orientation flat WO in the similar way, as shown in FIG. 15D. Thereafter, removing operation is performed on the circular edge portion of the wafer W from the other end Wc of the orientation flat WO to said one end Wa of the wafer W as the arm 39 is oriented in the predetermined direction with respect to the wafer W. In this way, the removing operation on the peripheral portion of the wafer W is completed. As also shown in FIG. 6, the positions of the orientation flat WO of the wafer W, the wafer W and the arm 39 are detected by the sensor 59.

The central position Wb of the orientation flat WO may be detected by the sensor 59, or the detected value of the end Wa of the orientation flat WO may be triggered and compared by the controller 60 based on the rotational speed of the spin chuck to find the position of the wafer W at which the removing operation is performed. In this embodiment, the removing operation is performed by moving the arm 39. However, this operation may be carried out by fixing the arm 39 and moving the spin chuck 24 with respect to the arm 39.

Another type of processing an article to be processed by the coated film removing mechanism 23 will be described with reference to FIGS. 16A and 16B.

As shown in FIG. 16A, a wafer W is held by the wafer holding portion 24a of the spin chuck 24 and is rotated by turning the spin chuck 24. After the arm 39 has been oriented in the predetermined direction with respect to the wafer W, the removing operation is performed. In this removing operation, the circular peripheral portion of the wafer W is processed, but the portion We of the orientation flat WO is left unprocessed at first. The portion We is processed in the following way. After the wafer W has been set so that the orientation flat WO is perpendicular to the arm 39, the removing operation is performed by moving the arm 39 in the Y direction, i.e., along the orientation flat WO or by moving the wafer W in the Y direction with respect to the arm 39 in a state in which the arm 39 is fixed. In this way, the removing operation is completed.

An article such as a wafer having a notch rather than an orientation flat which is widely used in the United States can be processed in similar manners. Using the sensor 59 to detect a position of the periphery of the wafer, the removal process may be carried out first on the circular portion of the article and subsequently the notch, or in the alternative the notch first and then the circular portion.

Processing of articles to be processed will be described with reference to a flow chart shown in FIG. 17.

First, the wafer W is mounted on the wafer holding potion 24a of the spin chuck 24 as shown by Step A. Then, the wafer W is rotated by turning the spin chuck 24 as shown by Step B. The rotational speed of the wafer W is set to a predetermined value within the range between 3,500 to 5,000 rpm for a 6-inch wafer and to a predetermined value within the range between 1,500 to 3,500 rpm for an 8-inch wafer. Then, a resist liquid is dropped on the central portion of the wafer W as shown by Step C. As the wafer W is rotated, the resist liquid spreads over the whole area of the surface of the wafer W. Then, the excessive resist is scattered from the peripheral portion of the wafer W, and uniform resist films are formed on the wafer W.

When a solvent which is preferably the same as the solvent contained in the resist liquid applied to the wafer W, a solvent comprising similar chemical components to the resist liquid, a mixture of these solvents, or a solvent including the mixture is applied to the surfaces of the wafer W before the resist liquid is dropped, the amount of the resist liquid applied to the wafer W can be reduced.

The rotational speed of the wafer W is reduced from the reduced speed, the unnecessary resist films are removed from the peripheral portion of the wafer W. The preferable predetermined reduced speed is within the range between 10 to 500 rpm. When the spin chuck 24 is lifted to the position at which the coated films are removed from the wafer W by reducing the rotational speed to the predetermined value, the throughput of the processing can be improved. Finally, the resist films are removed from the peripheral portion of the wafer W in the above-mentioned processes. In this way, a series of resist removing processes are completed. The dropping of the resist liquid as shown by Step C may be performed before rotating the wafer W as shown by Step B or during the accelerating period of the wafer W before the rotational speed is reduced to the above-mentioned predetermined speed in Step B.

Another type of processing articles to be processed by the coated film removing mechanism will be described with reference to FIGS. 18 and 19.

Figure 18:
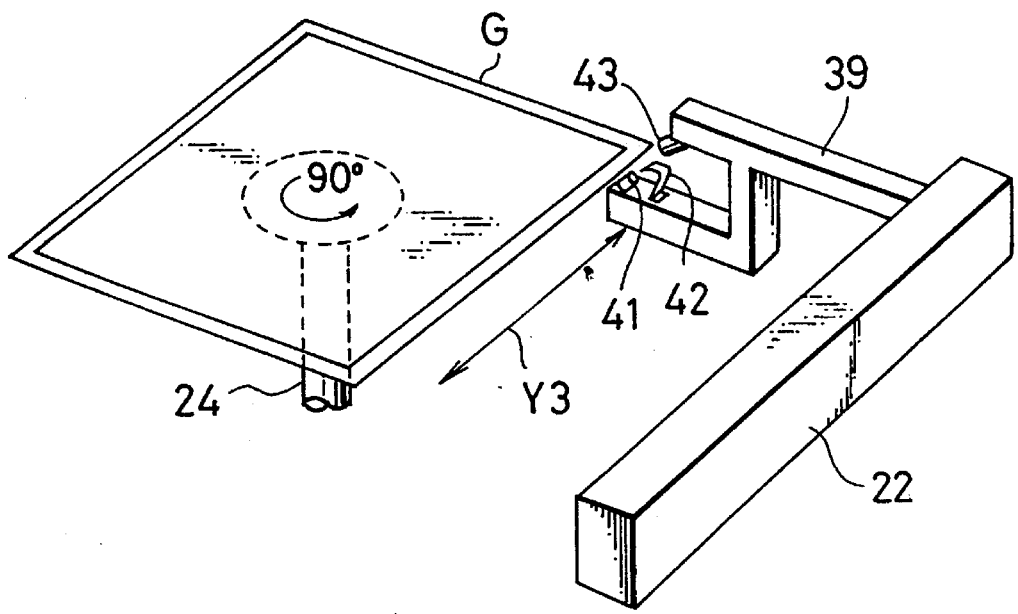
FIG. 18 is a general perspective view showing how to process another article to be processed by the coated film removing mechanism.
Figure 19:
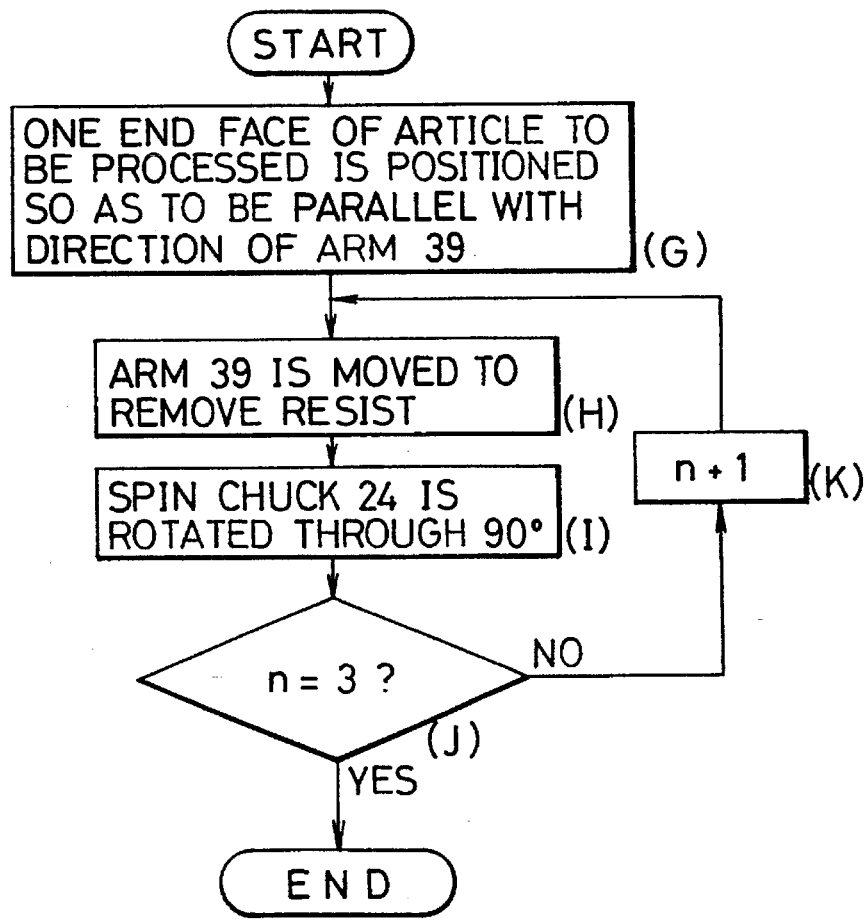
FIG. 19 is a general flow chart showing how to process an article to be processed by the coated film removing apparatus of FIG. 18.

As shown in FIG. 18, an LCD substrate G having a rectangular or square shape is held by the spin chuck 24. The LCD substrate is processed according to the steps shown in FIG. 19. In Step G, one end face of the LCD substrate G is positioned in parallel with the moving directions Y3 of the arm 39. In this case, the initial setting of the counter flag n showing the total number of the end faces of the LCD substrate G is made.

Next, the resist films formed on the peripheral portion of the end face is removed by moving the arm 39 in one of the Y2 directions as shown by Step H.

Figure 20:
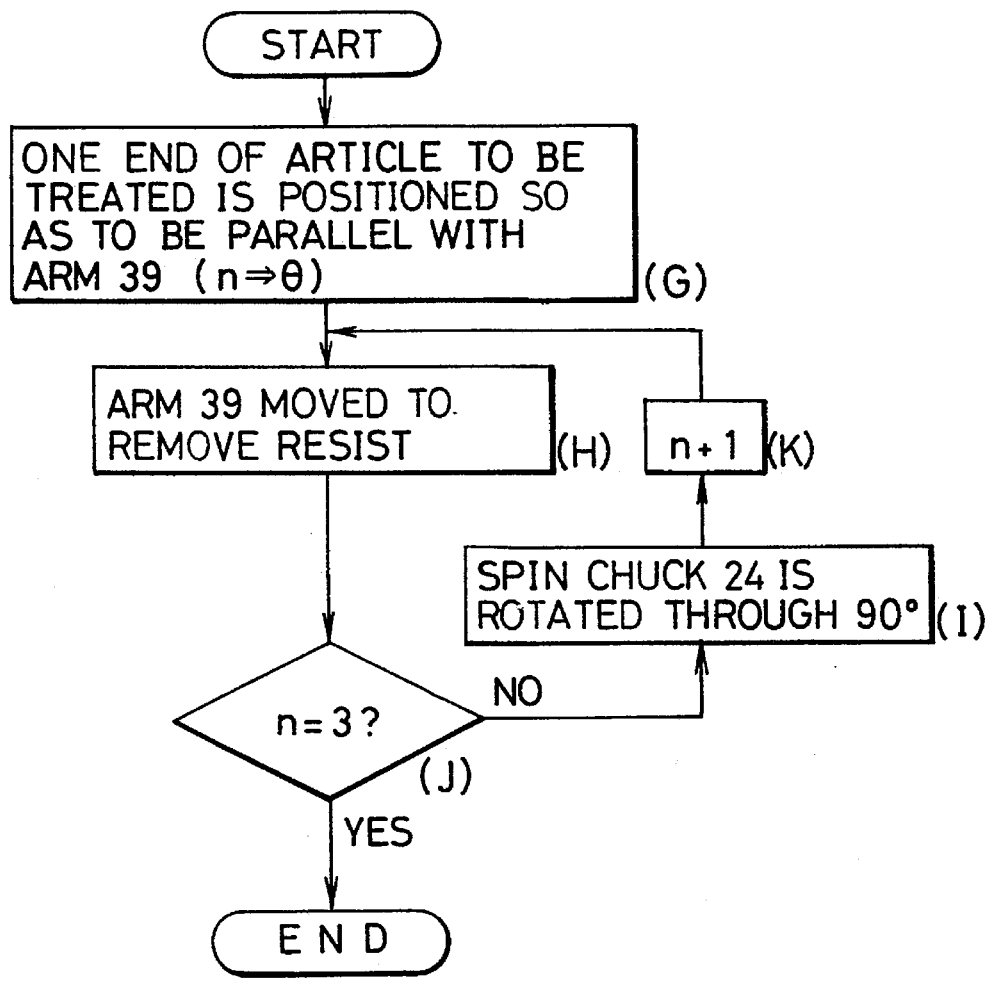
FIG. 20 is a general flow chart showing how to process an article to be processed by the coated film removing apparatus of FIG. 18 in another way.

As shown by Step I, the spin chuck 24 is rotated to turn the LCD substrate G through 90° so as to cause the next end face to be processed to face the arm 39. Then, the total number of the end faces of the LCD substrate minus one and the number of the counter flag n are compared. When both numbers are equal, the removing operation is finished. When both numbers are not equal, one is added to the counter flag n according to Step K, and Step H is carried out so that the coated films are removed from the remaining end faces of the LCD substrate G in turn. After Step J shown in FIG. 20, Step I is performed. Since useless rotation after having processed all edges of the wafer W is prevented in this embodiment, the throughput of the processing can be improved.

In this embodiment, the article to be processed is not limited to a rectangular or square LCD substrate G but may be an article having a complicated shape. The coated films can be removed from such an article which is not rectangular or square by properly controlling the rotational angle of the spin chuck 24. In particular, when a rectangular or square article to be processed like a rectangular or square LCD substrate is rotated, it is preferred that the processing cup 26 be rotated at the same or substantially the same rotational speed as the rotational speed of the article in the same or substantially the same rotational direction as the rotational direction of the article. By doing so, the problem is solved in which the resist liquid is not distributed evenly on the rectangular or square LCD G because disturbance of air flow occurs at the corners of the substrate when the LCD G is rotated and thus air flow is disturbed in the processing cup 26. It is preferred that the processing cup 26 be rotated when the article to be processed is a circular article such a wafer W.

Figure 21:
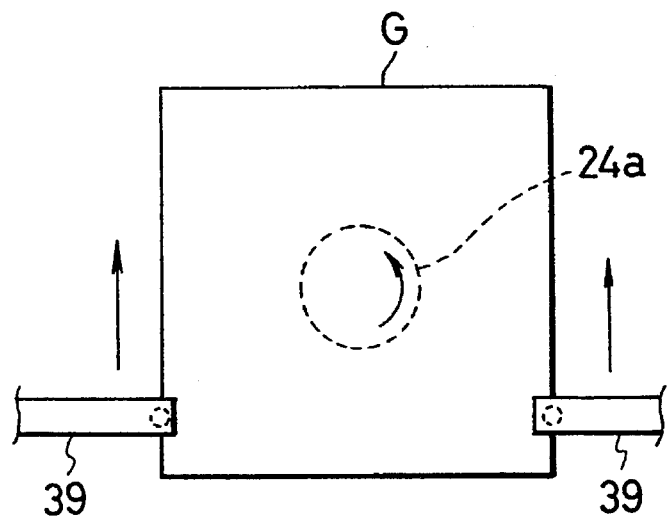
FIG. 21 is a general plan view of a further embodiment of the coated film removing mechanism for processing an article to be processed in FIG. 18.
Figure 22:
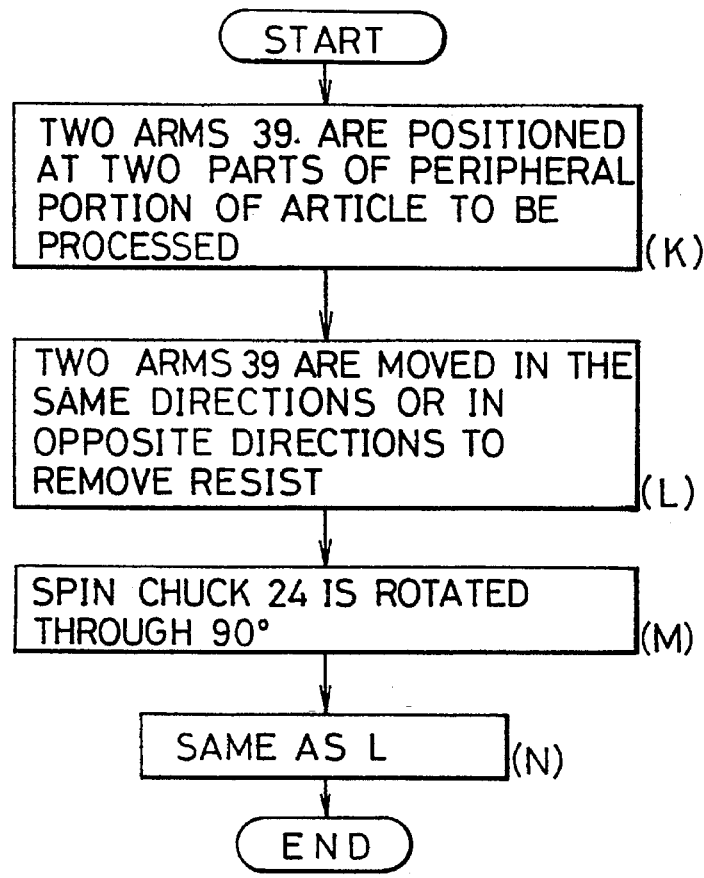
FIG. 22 is a general flow chart showing how to process the article to be processed by the coated film removing mechanism of FIG. 21.

Another embodiment for processing an LCD substrate G with reference to FIGS. 21 and 22.

As shown in FIG. 21, a square substrate G is held by the spin chuck 24. Two arms 39 of the coated film removing mechanism are arranged at a pair of opposed edges of the LCD substrate G.

The processing steps of this embodiments is shown in FIG. 22. In Step K, the arms 39 of the coated film removing mechanism are set in a predetermined position with respect to the LCD substrate G. Next, the arms 39 are moved in the same direction or in the opposite directions to remove the unnecessary resist films from the LCD substrate G in Step L. As shown by Step M, the spin chuck 24 is rotated to turn the LCD substrate G through 90° so as to cause the remaining end faces to be processed to face the corresponding arms 39.

Use of two coated film removing mechanisms can improve the throughput of the processing.

A further embodiment for processing an LCD substrate G will be described with reference to FIG. 23.

Figure 23:
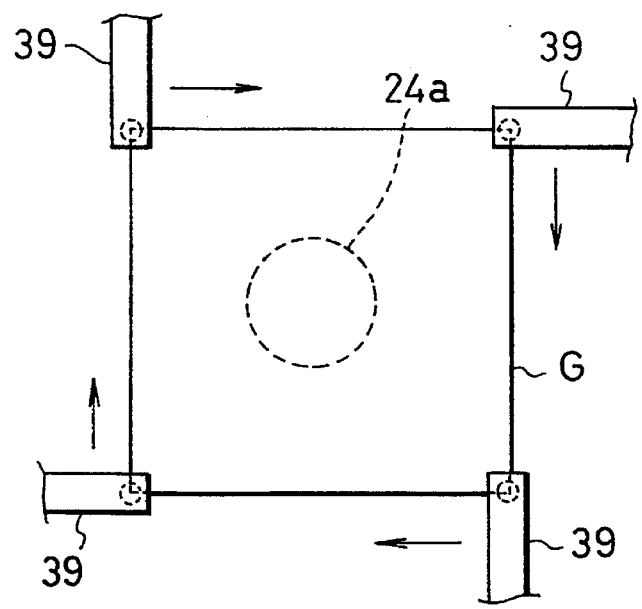
FIG. 23 is a general plan view of a still further embodiment for processing the article to be processed in FIG. 21.

As shown in FIG. 23, a square LCD substrate G is held by the spin chuck 24. Four arms 39 of the coated film removing mechanism are disposed so as to correspond to the respective four edges of the LCD substrate G.

In this embodiment, it is preferred that the arms 39 be moved in the clockwise direction and the unnecessary resist films be removed from the LCD substrate G. Since the all edges of the square LCD substrate G are processed by the coated film removing mechanisms arranged so as to correspond to all edges of the LCD substrate G at the same time, the throughout of the processing can be greatly improved.

In the embodiments as described above, the present invention is applied to the resist processing apparatuses. However, the present invention can also be applied to an etching liquid coating apparatus and a magnetic liquid coating apparatus.

What is claimed is:

1. An apparatus for an article having a processing liquid thereon comprising:

rotating means for holding and rotating one of said article to be processed;

a washing nozzle for jetting a washing liquid to a peripheral portion of an undersurface of said article at a first predetermined angle;

means for guiding the washing liquid jetted from the nozzle from the peripheral portion of the undersurface of the article through a peripheral edge to a peripheral portion of the upper surface thereof while the washing liquid dissolves the part of the process liquid layer; and collecting means for collecting said washing liquid from the upper surface of said article at a second predetermined angle.

2. An apparatus according to claim 1, wherein said first predetermined angle is within a range between 60° to 80° with respect to a horizontal plane of said article.

3. An apparatus according to claim 1, wherein said second predetermined angle is within a range between 45° to 80° with respect to a horizontal plane of said article.

4. An apparatus according to claim 1, wherein a guide plate is disposed at a predetermined distance from and under said article, for receiving said washing liquid between an upper surface of said guide plate and said undersurface of said article.

5. An apparatus according to claim 4, wherein a distance between said upper surface of said guide plate and said undersurface of said article is maximum 5 mm.

6. An apparatus according to claim 1, wherein said washing liquid contains at least one common chemical component as a solvent in said processing liquid.

7. An apparatus according to claim 1, further comprising a moving mechanism for simultaneously moving said washing nozzle and said collecting means to predetermined positions with respect to said article.

8. An apparatus according to claim 1, further comprising adjusting means for adjusting the first predetermined angle of said washing liquid from said washing nozzle.

9. An apparatus according to claim 1, wherein said sucking means is provided with a gas-liquid separator for separating gases and liquids and separately collecting said gases and said liquids.

10. A resist processing apparatus according to claim 1, wherein said washing nozzle means defines at least one slit-like outlet extending crosswise of said peripheral portion of said article.

11. An apparatus for removing a part of a processing liquid layer attached to a peripheral portion of an upper surface, a peripheral edge, and a peripheral portion of an undersurface of a circular substrate having a substantially circular edge and a cutout linear edge comprising:

means for supporting and rotating the substrate;

washing nozzle means for jetting a washing liquid to the peripheral portion of the undersurface of the substrate;

means for guiding the washing liquid jetted from the nozzle means to the peripheral portion of the upper surface of the substrate from the peripheral portion of the undersurface through the peripheral edge, while the washing liquid dissolves the part of the process liquid layer;

means for sucking the washing liquid and dissolved processing liquid from the peripheral portion of the upper surface of the article; and means for keeping the washing nozzle means and sucking means against the rotating substrate so that the washing liquid is jetted to the peripheral portion of the undersurface of the substrate, and the washing liquid and dissolved processing liquid are sucked from the peripheral portion of the undersurface of the substrate during a washing operation.

12. The apparatus according to claim 11, wherein said keeping means includes means for supporting the washing nozzle means and the sucking means, and means for moving the supporting means when the washing liquid is jetted to the portion near the cut-out linear edge, and for fixing the supporting means in a stationary state.

13. The apparatus according to claim 12, further comprising means for sensing the substantially circular edge and the cut-out linear edge and outputting an edge-information signal when the substrate is rotated wherein said moving means selectively moves the supporting means according to the edge-information signals.

14. An apparatus for removing a part of a processing liquid layer attached to a peripheral portion of an upper surface, a peripheral edge, and a peripheral portion of an undersurface of an article comprising:

washing nozzle means for jetting a washing liquid to the peripheral portion of the undersurface of the article;

means for guiding the washing liquid jetted from the nozzle means to the peripheral portion of the upper surface of the article from the peripheral portion of the undersurface through the peripheral edge, while the washing liquid dissolves the part of the process liquid layer; and means for sucking the washing liquid and dissolved processing liquid from the peripheral portion of the upper surface of the article.

15. The apparatus according to claim 14, further including sensing means for detecting the thickness of the part of the processing liquid layer attached to the peripheral edge of the substrate to output a detected signal; and means for controlling at least one of the position and/or angle of the washing nozzle means and the sucking means, an amount of the washing liquid jetted from the nozzle means, and a suction force of the sucking means according to the detected signal.

16. An apparatus according to claim 15, further comprising a guide plate disposed under said article, for receiving said washing liquid in a space defined between an upper surface of said guide plate and said undersurface of said article.

17. A resist processing apparatus according to claim 16, wherein a distance between said upper surface of said guide plate and said undersurface of said article is less than approximately 5 mm.

18. An apparatus according to claim 15, wherein said washing liquid contains at least one common chemical component as a solvent in said processing liquid.

19. An apparatus according to claim 15, further comprising a moving mechanism for simultaneously moving said washing nozzle and said collecting means to predetermined positions with respect to said article.

20. An apparatus according to claim 15, wherein said sucking means is provided with a gas-liquid separator for separating gases and liquids and separately collecting said gases and said liquids.

21. An apparatus according to claim 15, wherein said washing nozzle means defines at least one slit-like outlet extending crosswise of said peripheral portion of said article.

22. The apparatus according to claim 14, wherein said washing nozzle means is inclined at an angle ranging between 60° to 80° with respect to the undersurface of the article.

23. An apparatus according to claim 22, further comprising adjusting means for adjusting the inclined angle of said washing liquid from said washing nozzle.

24. The apparatus according to claim 14, wherein said sucking means is inclined at an angle ranging between 45° to 80° with respect to the upper surface of the article.

* * * * *